(12) United States Patent
Nishizawa (10) Patent No.: US 8,581,411 B2
(45) Date of Patent: Nov. 12, 2013

(54) SEMICONDUCTOR DEVICE

(75) Inventor: Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 223 days.

(21) Appl. No.: 12/766,966

(22) Filed: Apr. 26, 2010

(65) Prior Publication Data

US 2011/0042822 A1 Feb. 24, 2011

(30) Foreign Application Priority Data

Aug. 20, 2009 (JP) ................................. 2009-191093

(51) Int. Cl.
*H01L 23/48* (2006.01)

(52) U.S. Cl.
USPC ............... 257/774; 257/276; 257/748; 438/8; 438/214; 438/629; 427/84

(58) Field of Classification Search
USPC ......... 257/276, 473, 774, 783, 750–770, 748, 257/698; 438/575, 580, 8; 427/58, 84; 372/50.121
See application file for complete search history.

(56) References Cited

U.S. PATENT DOCUMENTS

| 3,642,528 | A | * | 2/1972 | Kimura | 438/580 |
|---|---|---|---|---|---|
| 4,179,533 | A | * | 12/1979 | Christou et al. | 438/575 |
| 5,027,189 | A | * | 6/1991 | Shannon et al. | 257/783 |
| 5,075,763 | A | * | 12/1991 | Spitzer et al. | 257/751 |
| 6,268,619 | B1 | * | 7/2001 | Kosaki et al. | 257/276 |
| 6,639,316 | B1 | * | 10/2003 | Toyosaki et al. | 257/748 |
| 7,892,860 | B2 | * | 2/2011 | Ohmi et al. | 438/8 |
| 2002/0030267 | A1 | * | 3/2002 | Suzuki | 257/698 |
| 2004/0016984 | A1 | * | 1/2004 | Lee et al. | 257/473 |
| 2004/0213895 | A1 | * | 10/2004 | Shingubara et al. | 427/58 |
| 2008/0012134 | A1 | * | 1/2008 | Choi et al. | 257/751 |
| 2008/0240188 | A1 | * | 10/2008 | Ohmi et al. | 372/43.01 |
| 2009/0067466 | A1 | * | 3/2009 | Miyazaki | 372/50.121 |

FOREIGN PATENT DOCUMENTS

| GB | 2 285 174 A | 6/1995 |
|---|---|---|
| JP | 4-211137 A | 8/1992 |
| JP | 7-193214 A | 7/1995 |
| JP | 2007-157883 A | 6/2007 |

OTHER PUBLICATIONS

Taiwan Patent Office; Examination Report in Taiwan Patent Application No. 099111380 (May 31, 2013).

* cited by examiner

*Primary Examiner* — Eugene Lee
*Assistant Examiner* — Fang-Xing Jiang
(74) *Attorney, Agent, or Firm* — Leydig, Voit & Mayer, Ltd.

(57) ABSTRACT

A semiconductor device comprises a GaAs substrate having a first major surface and a second major surface opposite to each other; a first metal layer composed of at least one of Pd, Ta, and Mo on the first major surface of the GaAs substrate; and a second metal layer composed of a Ni alloy or Ni on the first metal layer.

12 Claims, 13 Drawing Sheets

SEMICONDUCTOR DEVICE

BACKGROUND OF THE INVENTION

1. Field of the Invention

The present invention relates to a semiconductor device including a GaAs substrate, and an electrode layer formed on the back surface of the substrate and composed of an Ni alloy or Ni, and a method for manufacturing the same. Specifically, the present invention relates to a semiconductor device that can prevent the wafer from warping, and a method for manufacturing the same.

2. Background Art

Conventionally, a semiconductor device having an electrode layer composed of Ni formed on the back surface of a GaAs substrate for preventing the occurrence of cracks on the GaAs substrate is known (for example, Japanese Patent Laid-Open No. 4-211137). In addition, to reinforce the GaAs substrate thinned by grinding, an electrode layer composed of an Ni alloy or Ni may be formed on the back surface of the GaAs substrate.

Furthermore, the properties of the chip measured in the state of a wafer may be changed by application of heat to the chip after the chip is diced from the wafer. In order to prevent this phenomenon, heat treatment may be carried out to the wafer before dicing into chips.

SUMMARY OF THE INVENTION

When a semiconductor device is manufactured by forming an electrode layer composed of an Ni alloy or Ni on the back surface of the thinned GaAs substrate, the wafer including the GaAs substrate and the electrode layer may be subjected to heat treatment so as to prevent change in the properties of the above-described chip. In this case, Ni may be diffused from the electrode layer into the GaAs substrate.

When the diffusion occurs, an Ni—GaAs diffused layer is formed at the interface between the GaAs substrate and the electrode layer. It is known that the Ni—GaAs diffused layer is an $Ni_2GaAs$ layer epitaxially formed in the (100) plane of the GaAs substrate (A. Lahav, J. Appi. Phys., 60, 991 (1986)). Then, as shown in Table 1, about 4% of lattice mismatching occurs between the GaAs substrate and the Ni—GaAs diffused layer. Thereby, the GaAs substrate and the Ni—GaAs diffused layer is subjected to stress from the Ni—GaAs diffused layer and the GaAs substrate, respectively.

TABLE 1

| Crystal | Lattice constant | Structure |
| --- | --- | --- |
| $Ni_2GaAs$ | a = 0.383, c = 0.504 | Hexagonal crystal |
| GaAs | a = 0.400, c = 0.490 (*) | Cubic crystal |

(*) The lattice constant of GaAs is the value when the GaAs is assumed to have a pseudo-cubic structure.

Figure 1:
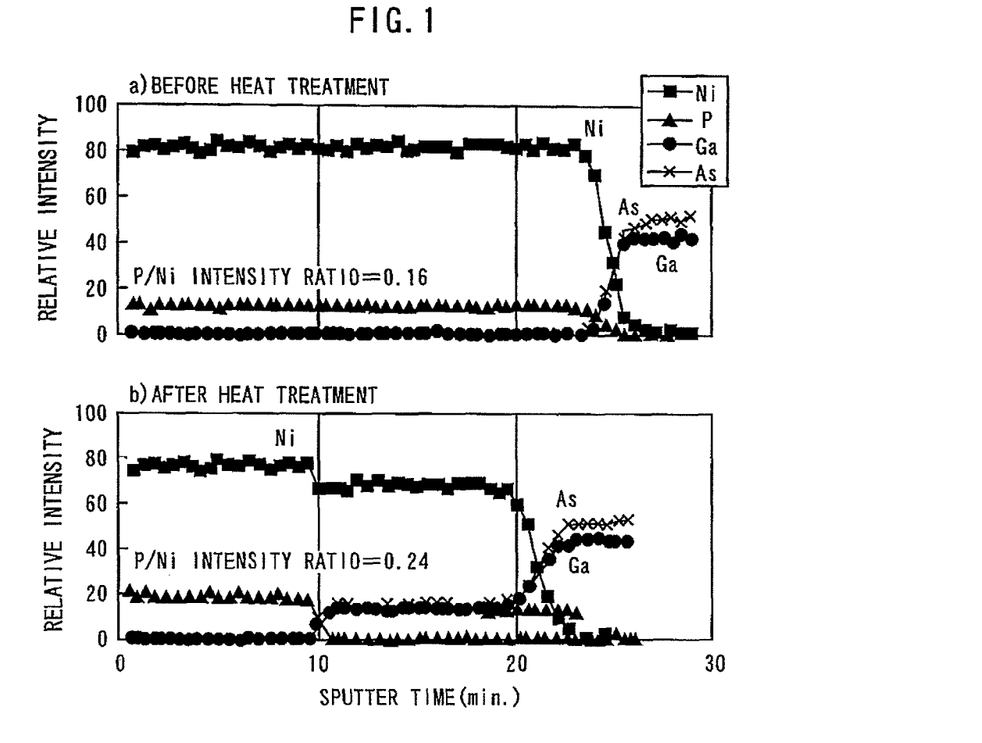
FIG. 1 is a graphical representation showing the results of an in-depth Auger analysis of a wafer wherein an electrode layer composed of Ni—P is formed by electroless plating on the back surface of a GaAs substrate, before and after heat treatment at 250° C. for 4 hours.
Figure 2:
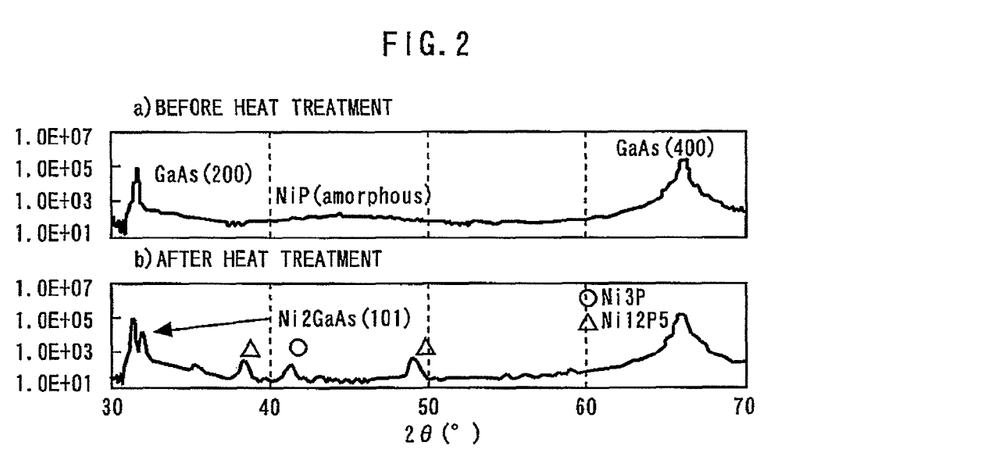
FIG. 2 is a graphical representation showing the results of an XRD crystallinity analysis of a wafer wherein an electrode layer composed of Ni—P having a thickness of 0.3 μm on the back surface of a GaAs substrate, before and after heat treatment at 250° C. for 4 hours.

FIG. 1 is a graphical representation showing the results of an in-depth Auger analysis of a wafer wherein an electrode layer composed of Ni—P is formed by electroless plating on the back surface of a GaAs substrate, before and after heat treatment at 250° C. for 4 hours. FIG. 2 is a graphical representation showing the results of an XRD crystallinity analysis of a wafer wherein an electrode layer composed of Ni—P having a thickness of 0.3 μm on the back surface of a GaAs substrate, before and after heat treatment at 250° C. for 4 hours.

As shown in the charts of FIG. 1, the content of P in the electrode layer after the heat treatment is elevated to about 1.5 times more than the content of P in the electrode layer before the heat treatment. In the chart showing the result before the heat treatment shown in FIG. 2, a broad peak indicating the amorphousness of Ni—P appears; however, in the chart showing the result after the heat treatment shown in FIG. 2, peaks indicating $Ni_3P$ and $Ni_{12}P_5$ appear instead.

As seen from these results, in the electrode layer composed of an Ni alloy, the composition of the Ni alloy is changed, and the Ni alloy is crystallized by the diffusion of Ni as described above. When crystallized, the electrode layer shrinks. As a result, the GaAs substrate is subjected to stress from the electrode layer.

As described above, the GaAs substrate is subjected to stress from both the Ni—GaAs diffused layer and the electrode layer. The Ni—GaAs diffused layer is subjected to stress from the GaAs substrate. Therefore, when heat treatment is carried out to the wafer including the GaAs substrate and the electrode layer composed of an Ni alloy or Ni formed on the back surface of the GaAs substrate, the wafer may warp.

Figure 3:
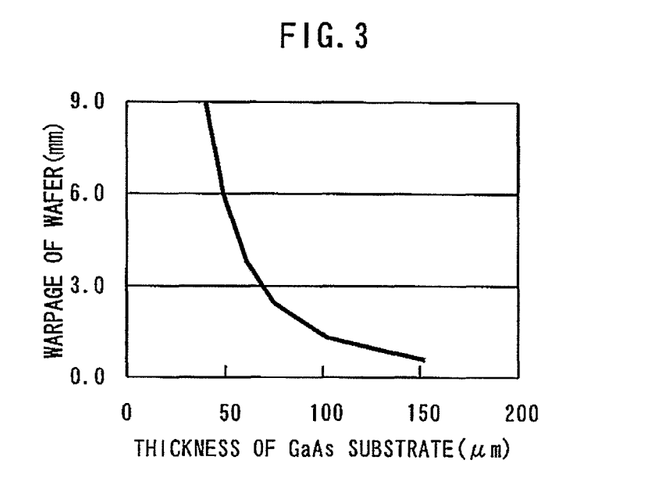
FIG. 3 is a graphical representation showing the relation between the warpage of the wafer and the thickness of the GaAs substrate when a heat treatment at 250° C. is carried out for 4 hours on the wafer wherein an Ni—P layer having a thickness of 0.3 mm as an electrode layer and an Au layer having a thickness of 4 μm are sequentially formed on the back surface of the GaAs substrate.

FIG. 3 is a graphical representation showing the relation between the warpage of the wafer and the thickness of the GaAs substrate when a heat treatment at 250° C. is carried out for 4 hours on the wafer wherein an Ni—P layer having a thickness of 0.3 μm as an electrode layer and an Au layer having a thickness of 4 μm are sequentially formed on the back surface of the GaAs substrate. When the thickness of the GaAs substrate is 50 μm, the warpage of the wafer is about 6 mm. Normally, if the warpage of the wafer becomes 3 mm or more, problems are caused in the testing process or dicing process of the wafer. If the thickness of the GaAs substrate is 50 μm, problems are caused in these processes.

In view of the above-described problems, an object of the present invention is to provide a semiconductor device that can prevent the wafer from warping, and a method for manufacturing the same.

According to a first aspect of the present invention, a semiconductor device comprises a GaAs substrate having a first major surface and a second major surface opposite to each other; a first metal layer composed of at least one of Pd, Ta, and Mo on the first major surface of the GaAs substrate; and a second metal layer composed of an Ni alloy or Ni on the first metal layer.

According to a second aspect of the present invention, a method for manufacturing a semiconductor device comprises forming a first metal layer composed of at least one of Pd, Ta, and Mo on a first major surface of a GaAs substrate; forming a second metal layer composed of an Ni alloy or Ni on the first metal layer; and annealing the GaAs substrate, the first metal layer, and the second metal layer.

The present invention makes it possible to prevent the wafer from warping.

Other and further objects, features and advantages of the invention will appear more fully from the following description.

DETAILED DESCRIPTION OF THE PREFERRED EMBODIMENTS

First Embodiment

Figure 4:
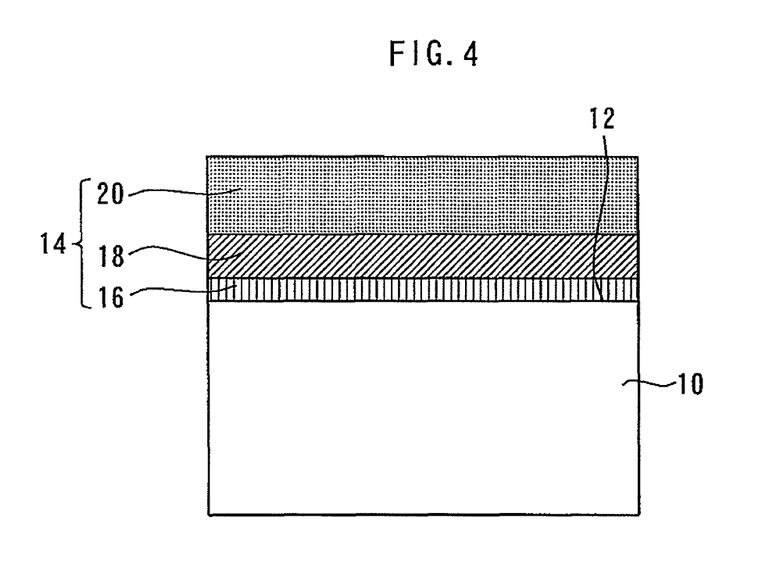
FIG. 4 is a sectional view showing a semiconductor device according to the first embodiment of the present invention.

FIG. 4 is a sectional view showing a semiconductor device according to the first embodiment of the present invention. An electrode layer 14 is formed on the first major surface 12 of a GaAs substrate 10. The electrode layer 14 includes a diffusion barrier layer (first metal layer) 16 formed on the first major surface 12 of the GaAs substrate 10, an Ni-alloy layer (second metal layer) 18 formed on the diffusion barrier layer 16, and the high-conductivity layer 20 formed on the Ni-alloy layer 18.

The diffusion barrier layer 16 is composed of Pd, and has a thickness of 0.05 μm. The Ni-alloy layer 18 is composed of Ni—P, and has a thickness of 0.3 μm. The high-conductivity layer 20 is composed of Au, and has a thickness of 4 μm.

Figure 5:
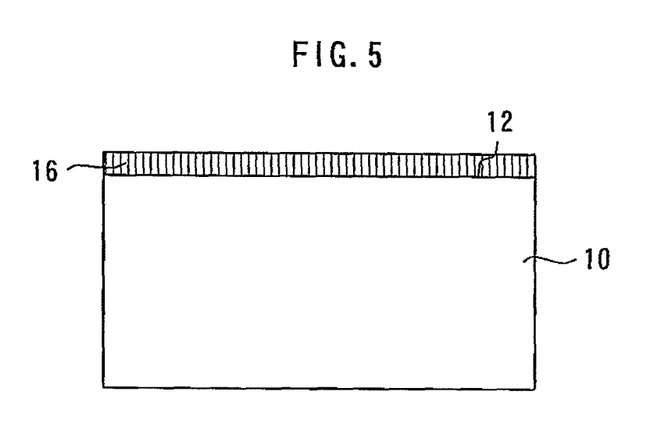
FIGS. 5 to 7 are views for explaining a method of manufacturing a semiconductor device according to the first embodiment of the present invention.
Figure 6:
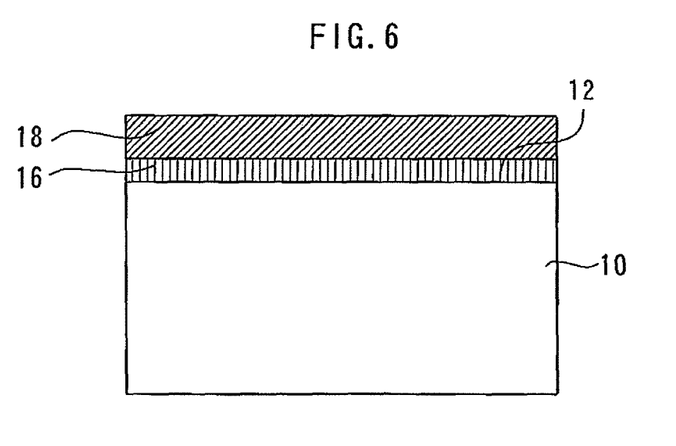
Figure 7:
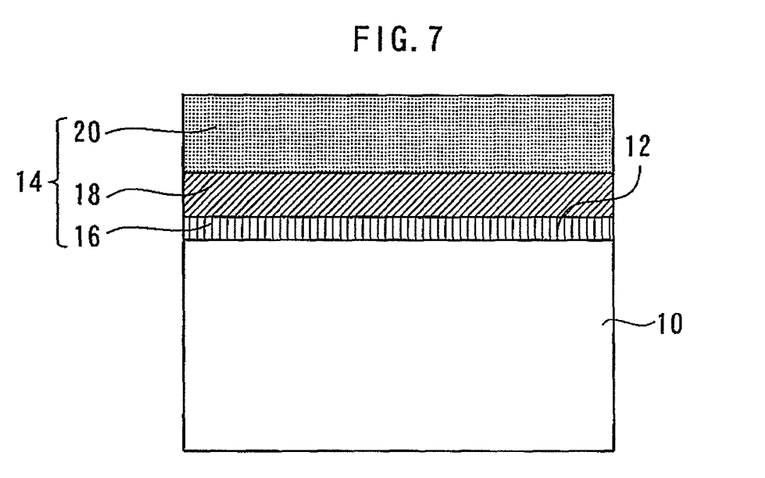

FIGS. 5 to 7 are process diagrams showing the method for manufacturing a semiconductor device according to the first embodiment. The method for manufacturing a semiconductor device will be described referring to FIGS. 5 to 7.

First, as shown in FIG. 5, the diffusion barrier layer (first metal layer) 16 is formed by sputtering on the first major surface 12 on the GaAs substrate 10. Here, the diffusion barrier layer 16 is composed of Pd. and the thickness thereof is 0.05 μm.

Next, as shown in FIG. 6, an Ni-alloy layer (second metal layer) 18 is formed on the diffusion barrier layer 16 by electroless plating. Here, the electroless displacement reduction plating of diffusion barrier layer 16 can be realized by performing Pd activation as a pretreatment. The Ni-alloy layer 18 is composed of Ni—P, and the thickness thereof is 0.3 μm. If the diffusion barrier layer 16 is composed of Pd, the pretreatment, i.e., Pd activation process can be omitted.

Next, a displaced Au-plated layer (not shown) is formed on the Ni-alloy layer 18. Here, the thickness of the displaced Au-plated layer is about 0.05 μm.

Next, as shown in FIG. 7, a high-conductivity layer 20 is formed on the Ni-alloy layer 18 by electrolytic plating using the displaced Au-plated layer as a seed layer. Here, the high-conductivity layer 20 is composed of Au, and the thickness thereof is 4 μm. The conductivity of the electrode layer 14 is ensured by the high-conductivity layer 20. By the processes described above, the electrode layer 14 including the diffusion barrier layer 16, the Ni-alloy layer 18, and the high-conductivity layer 20 can be formed.

Next, the entire semiconductor device including the GaAs substrate 10, the diffusion barrier layer 16, the Ni-alloy layer 18, and the high-conductivity layer 20 is annealed at 250° C.

Figure 8:
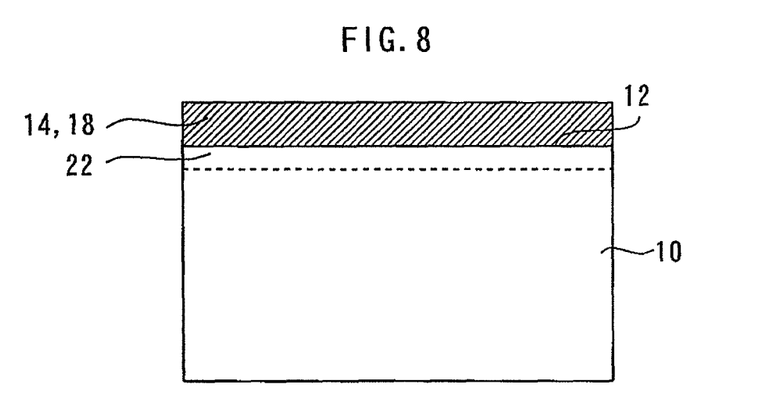
FIG. 8 is a sectional view showing a semiconductor device according to the first comparative example.

FIG. 8 is a sectional view showing a semiconductor device according to the first comparative example. Effect of the first embodiment will be described referring to FIG. 8.

In the semiconductor device according to the first comparative example, an Ni-alloy layer 18 is formed as the electrode layer 14 on the first major surface 12 of the GaAs substrate 10. However, the diffusion barrier layer 16 is not provided between the GaAs substrate 10 and the Ni-alloy layer 18. On the Ni-alloy layer 18, a high-conductivity layer 20 is not provided.

Consequently, as described above, when the entire device including the GaAs substrate 10 and the Ni-alloy layer 18 is annealed at 250° C., Ni is diffused from the Ni-alloy layer 18 into the GaAs substrate 10. Thereby, the Ni—GaAs diffused layer 22 is formed and the GaAs substrate 10 and the Ni—GaAs diffused layer 22 are subjected to stress. Therefore, the problem of warpage of the wafer including the GaAs substrate 10 and the Ni-alloy layer 18 is caused.

On the other hand, in the semiconductor device according to the first embodiment, the diffusion barrier layer 16 is formed between the GaAs substrate 10 and the Ni-alloy layer 18. The diffusion barrier layer 16 is composed of Pd, and has a thickness of 0.05 μm.

Figure 9:
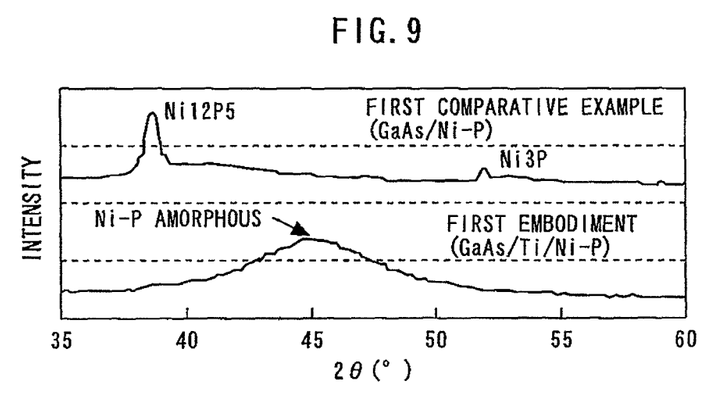
FIG. 9 is a graphical representation showing the results of XRD crystal analyses on a wafer according to the first embodiment and a wafer according to the first comparative example.
Figure 10:
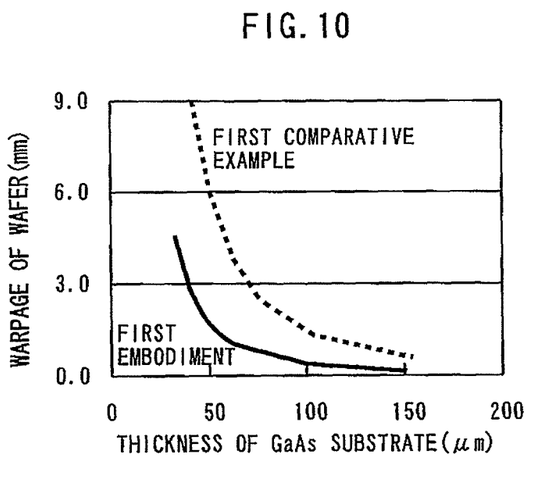
FIG. 10 is a graphical representation showing the relation between warpage of the wafer and the thickness of the GaAs substrate according to the first embodiment, and the relation between warpage of the wafer and the thickness of the GaAs substrate according to the first comparative example.

Therefore, diffusion of Ni from the Ni-alloy layer 18 into the GaAs substrate 10 can be prevented. FIG. 9 is a graphical representation showing the results of XRD crystal analyses on a wafer according to the first embodiment and a wafer according to the first comparative example. FIG. 10 is a graphical representation showing the relation between warpage of the wafer and the thickness of the GaAs substrate according to the first embodiment, and the relation between warpage of the wafer and the thickness of the GaAs substrate according to the first comparative example. It is seen from the results of the XRD crystal analyses that no peaks of $Ni_3P$ and $Ni_{12}P_5$ are observed in the first embodiment compared with the first comparative example. This indicates suppression of crystallization of Ni—P that constitutes the Ni-alloy layer 18. In the first embodiment, warpage of the wafer is lowered to ½ or less in comparison with the first comparative example.

Hence, crystallization of the Ni-alloy in the Ni-alloy layer 18 can be suppressed. Formation of the Ni—GaAs diffused layer 22 on the GaAs substrate can also be suppressed. As a result, the GaAs substrate and the Ni—GaAs diffused layer are not subjected to stress. Therefore, warpage of the wafer can be prevented.

Unlike the semiconductor device according to the first comparative example, in the semiconductor device according to the first embodiment, the high-conductivity layer 20 is formed on the Ni-alloy layer 18. The high-conductivity layer 20 is composed of Au. Since Au has a higher conductivity than Ni—P that constitutes the Ni-alloy layer 18, the conductivity of the electrode layer 14 can be improved.

A variation of the first embodiment will be described below. In the semiconductor device according to the first embodiment, the diffusion barrier layer 16 need not be composed of Pd. If the diffusion barrier layer 16 is composed of at least one of Pd, Ta, and Mo, the diffusion of Ni from the Ni-alloy layer 18 into the GaAs substrate 10 can be prevented. Therefore, warpage of the wafer can be prevented. This variation can be applied to the following embodiments.

Figure 11:
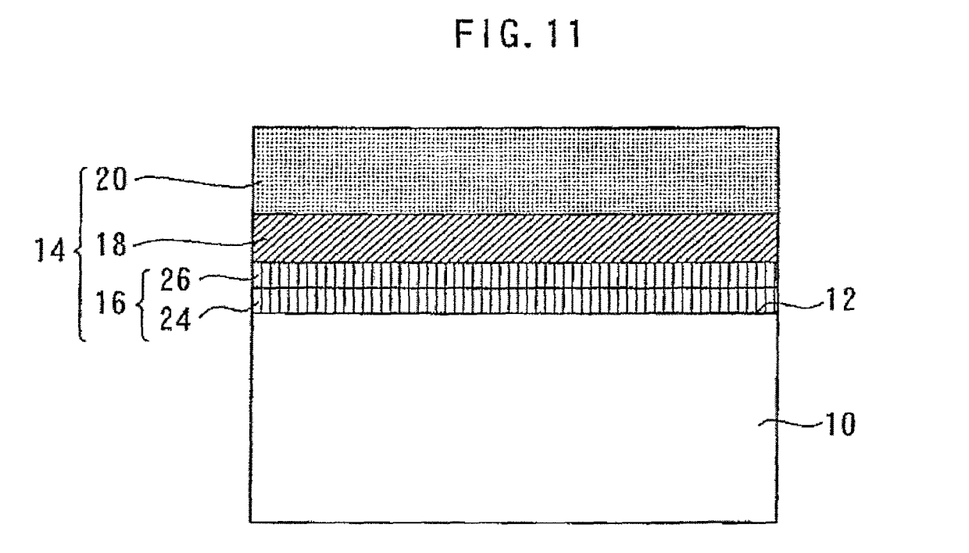
FIG. 11 is a longitudinal section view showing a semiconductor device according to the variation of the first embodiment.

FIG. 11 is a longitudinal section view showing a semiconductor device according to the variation of the first embodiment. In this variation, the diffusion barrier layer 16 includes the first diffusion barrier layer (fourth metal layer) 24 and the second diffusion barrier layer (fifth metal layer) 26. The first diffusion barrier layer 24 is composed of Ta, and is directly formed on the first major surface 12 of the GaAs substrate 10. The second diffusion barrier layer 26 is composed of Mo, and is formed between the first diffusion barrier layer 24 and Ni-alloy layer 18.

In the method for manufacturing a semiconductor device according to the variation, first, a first diffusion barrier layer 24 is formed on the first major surface 12 on a GaAs substrate 10. Next, a second diffusion barrier layer 26 is formed on the first diffusion barrier layer 24. Next, an Ni-alloy layer 18 is formed on the first diffusion barrier layer 24.

Ta has a higher adhesiveness to the GaAs substrate 10 than Pd and Mo, which are other constituent materials of the diffusion barrier layer 16. Mo prevents diffusion of Ni more effectively than Pd and Ta, which are other constituent materials of the diffusion barrier layer 16. Therefore, in the semiconductor device according to the variation, warpage of the wafer can be prevented more effectively than the first embodiment, and the adhesiveness of the electrode layer 14 to the GaAs substrate 10 can be improved. This variation can be also applied to the following embodiments.

The thickness of the diffusion barrier layer 16 is not limited to 0.05 μm. Warpage of the wafer can be surely prevented as long as the thickness is 0.05 μm or more. In addition, even if the thickness of the diffusion barrier layer 16 is less than 0.05 μm, the effect to prevent warpage of the wafer can be obtained. This variation can also be applied to the following embodiments.

The Ni-alloy layer 18 need not be composed of Ni—P, but may be composed of Ni—B. Furthermore, the electrode layer 14 may include a metal layer composed of Ni in place of the Ni-alloy layer 18. In these cases, although a problem is caused that Ni is diffused into the GaAs substrate 10, the effect to prevent warpage of the wafer can be obtained. This variation can also be applied to the following embodiments.

Figure 12:
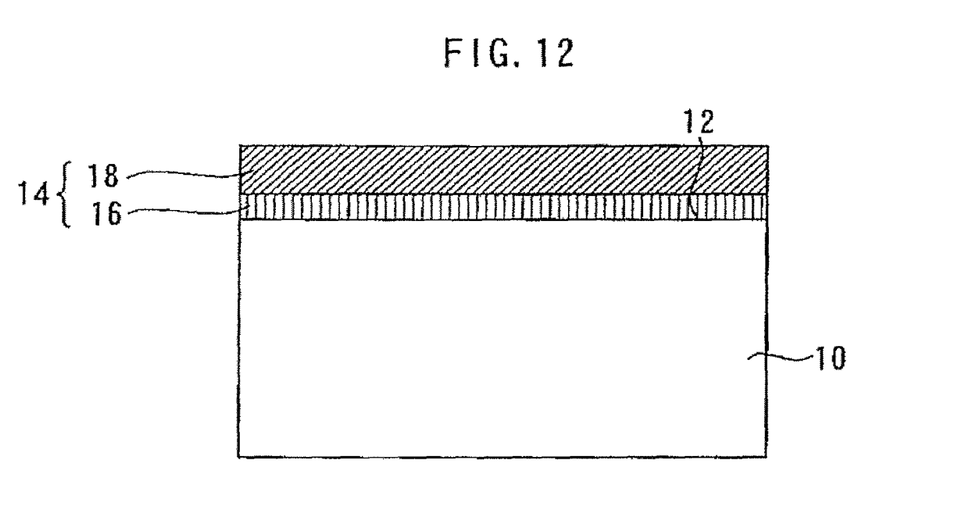
FIG. 12 is a longitudinal section view showing a semiconductor device according to a variation of the first embodiment.

FIG. 12 is a longitudinal section view showing a semiconductor device according to a variation of the first embodiment. In this variation, the high-conductivity layer 20 is not provided on the Ni-alloy layer 18. In the method for manufacturing a semiconductor device according to this variation, after forming the Ni-alloy layer 18, the high-conductivity layer 20 is not formed on the Ni-alloy layer 18. Therefore, the structure of the semiconductor device and the manufacturing method thereof are simplified in comparison with the first embodiment; and as in the first embodiment, warpage of the wafer can be prevented.

The high-conductivity layer 20 need not be composed of Au, but may be composed of Ag or Cu. Since Ag or Cu has a higher conductivity than Ni—P, the conductivity of the electrode layer 14 can be improved. In addition, the thickness of the high-conductivity layer 20 is not limited to 4 μm. If the thickness is 0.1 micrometer to several tens of micrometers, the conductivity of the electrode layer 14 can be improved. These variations can also be applied to the following embodiments.

Furthermore, a diffusion barrier layer composed of Pd (not shown) can be provided between the Ni-alloy layer 18 and the high-conductivity layer 20. Thereby, diffusion of Ni from the Ni-alloy layer 18 into the high-conductivity layer 20 can be prevented. This variation can also be applied to the following embodiments.

In the method for manufacturing a semiconductor device according to the first embodiment, the diffusion barrier layer 16 may be formed by not only sputtering but also vapor deposition. When the diffusion barrier layer 16 is composed of Pd, the diffusion barrier layer 16 may be formed by electroless plating. In this case, a seed layer having a thickness of several tens of nanometers is formed using a Pd activation solution, sputtering or vapor deposition. Then, the diffusion barrier layer 16 is formed on the seed layer. These variations can also be applied to the following embodiments.

Furthermore, when the diffusion barrier layer 16 is composed of Pd, the diffusion barrier layer 16 may be formed by electrolytic plating. In this case, however, it is required to form a power feeding layer as the base of the diffusion barrier layer 16. As the power feeding layer, for example, a layer made by sequentially forming a Ti layer and an Au layer can be considered. This variation can also be applied to the following embodiments.

When an Ni-alloy layer 18 or a metal layer composed of Ni is formed, not only electroless plating, but also electrolytic plating, vapor deposition, or sputtering can be used. When the Ni-alloy layer 18 is formed by electrolytic plating, a power feeding layer composed of Au is formed on the diffusion barrier layer 16 as the base of the Ni-alloy layer 18. Here, the power feeding layer is formed by displacement Au plating, and the thickness thereof is 50 nm or more. This variation can also be applied to the following embodiments.

In place of forming the displacement Au-plated layer as the seed layer of the high-conductivity layer 20, an Au layer may be formed using vapor deposition. The Au layer also becomes a seed layer. This variation can also be used in the following embodiments.

Furthermore, when the high-conductivity layer 20 is formed, not only electrolytic plating, but also electroless plating may be used. This variation can also be used in the following embodiments.

Second Embodiment

Figure 13:
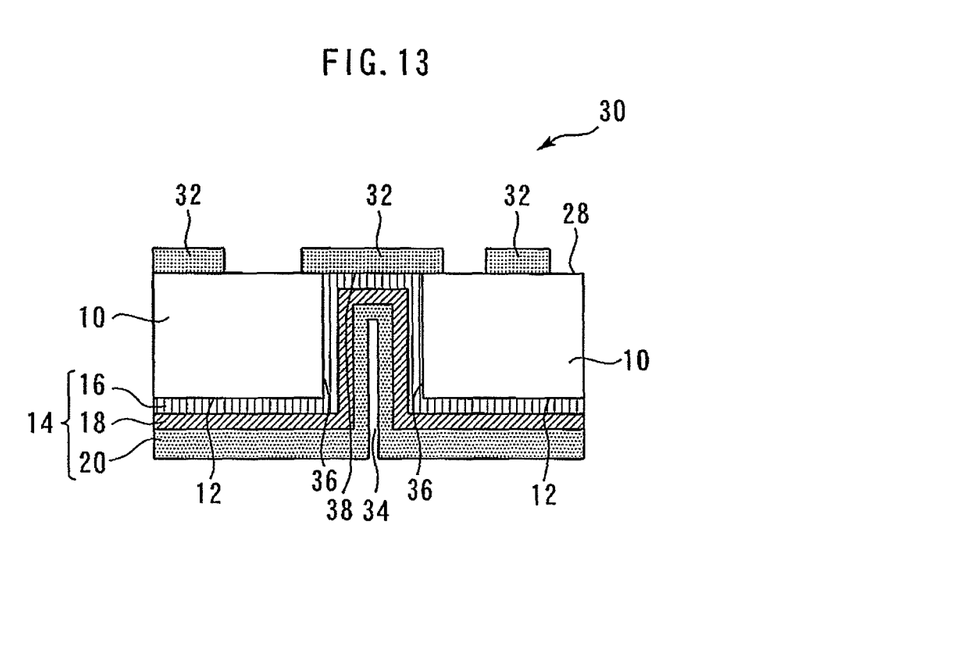
FIG. 13 is a sectional view showing a semiconductor device according to the second embodiment of the present invention.

FIG. 13 is a sectional view showing a semiconductor device according to the second embodiment of the present invention. An integrated circuit 30 is formed on the second major surface 28 of the GaAs substrate 10. The integrated circuit 30 includes a grounding electrode 32 connected to the wiring (not shown) of the integrated circuit 30. In the GaAs substrate 10, a through-hole 34 passing through from the first major surface 12 to the location of the grounding electrode 32 on the second major surface 28 is formed.

On the first major surface 12 of the GaAs substrate 10 and in the through-hole 34, an electrode layer 14 is formed. The electrode layer 14 includes a diffusion barrier layer (first metal layer) 16 formed on the first major surface 12 of the GaAs substrate 10, an Ni-alloy layer (second metal layer) 18 formed on the diffusion barrier layer 16, and the high-conductivity layer 20 formed on the Ni-alloy layer 18.

The diffusion barrier layer 16 is composed of Pd, and is formed on the sides 36 of the through-hole 34 and the exposed surface 38 in the through-hole of the grounding electrode. The diffusion barrier layer 16 is connected to the grounding electrode 32. The thickness of the diffusion barrier layer 16 is 0.05 μm.

The Ni-alloy layer 18 is composed of Ni—P, and is formed on the diffusion barrier layer 16 in the through-hole 34. The thickness of the Ni-alloy layer 18 is 0.3 μm. The high-conductivity layer 20 is composed of Au, and is formed on the Ni-alloy layer 18 in the through-hole 34. The thickness of the high-conductivity layer 20 is 4 μm.

FIGS. 14 to 19 are process diagrams showing a method for manufacturing the semiconductor device according to the second embodiment. The method for manufacturing the semiconductor device will be described referring to FIGS. 14 to 19.

Figure 14:
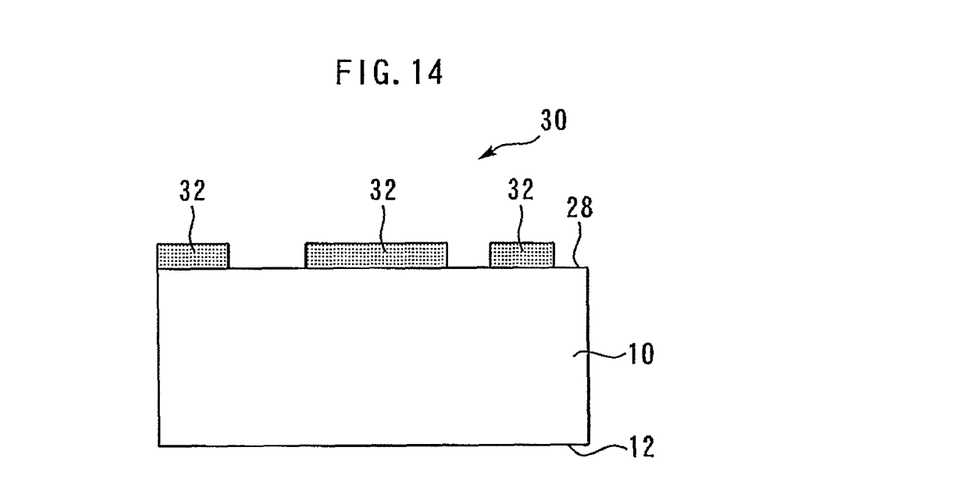
FIGS. 14 to 19 are views for explaining a method of manufacturing a semiconductor device according to the second embodiment of the present invention.

First, as shown in FIG. 14, an integrated circuit 30 including grounding electrodes 32 is formed on the second major surface 28 of the GaAs substrate 10. Here, the grounding electrodes 32 are connected to the wirings (not shown) of the integrated circuit 30.

Figure 15:
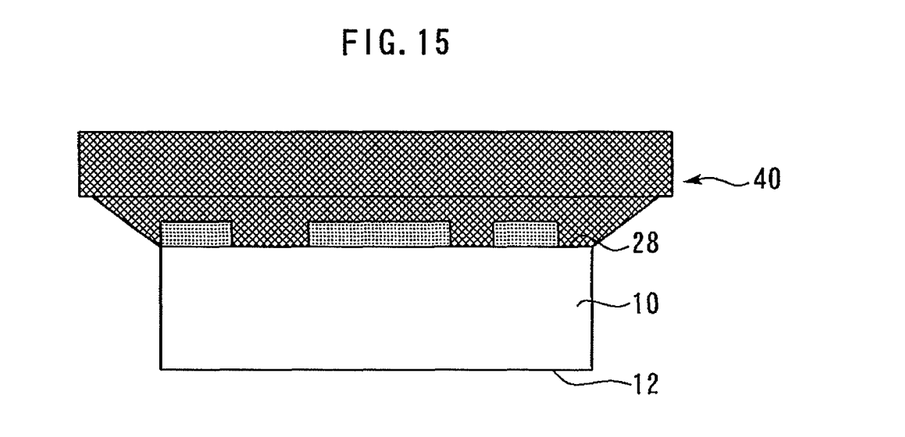

Next, as shown in FIG. 15, a glass substrate 40 is applied to the second major surface 28 of the GaAs substrate 10 using wax (not shown). In this state, the first major surface 12 of the GaAs substrate 10 is ground to reduce the thickness of the GaAs substrate 10 to about 30 to 100 μm.

Figure 16:
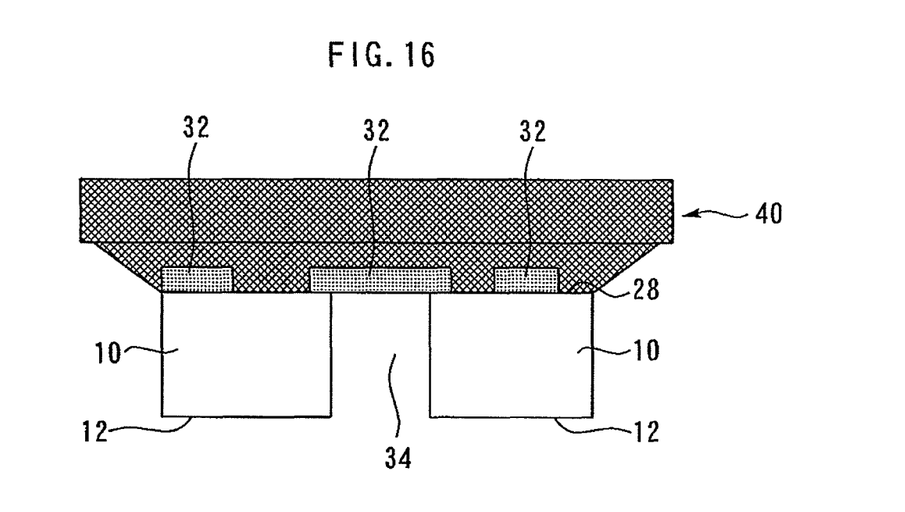

Next, a resist is patterned on the first major surface 12 of the GaAs substrate 10 and dry etched. Thereby, as shown in FIG. 16, a through-hole 34 is formed from the first major surface 12 facing the second major surface 28 to the location of the grounding electrodes 32 on the second major surface 28. After the through-hole 34 is formed, the resist is removed by treatment with an organic material or ashing.

Figure 17:
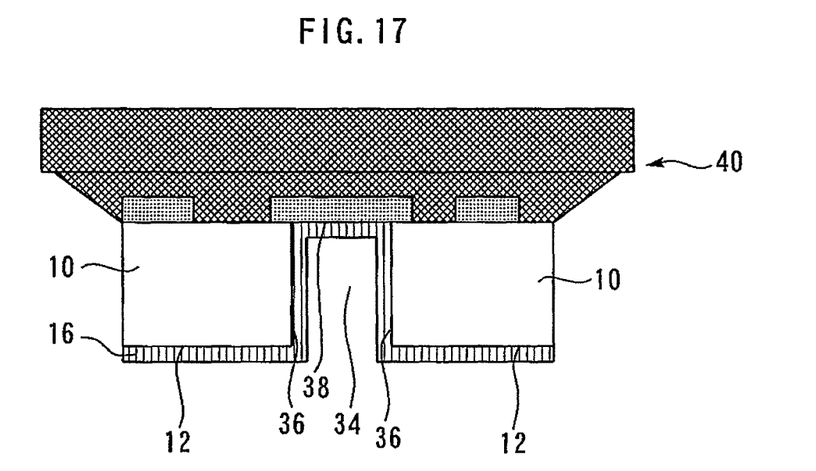

Next, as shown in FIG. 17, a diffusion barrier layer (first metal layer) 16 is formed on the first major surface 12 of the GaAs substrate 10 and in the through-hole 34 using electroless plating. Here, the diffusion barrier layer 16 is formed on the sides 36 of the through-hole 34 and on the exposed surface 38 of the grounding electrode 32 in the through-hole 34. The diffusion barrier layer 16 is composed of Pd, and the thickness thereof is 0.05 μm.

Figure 18:
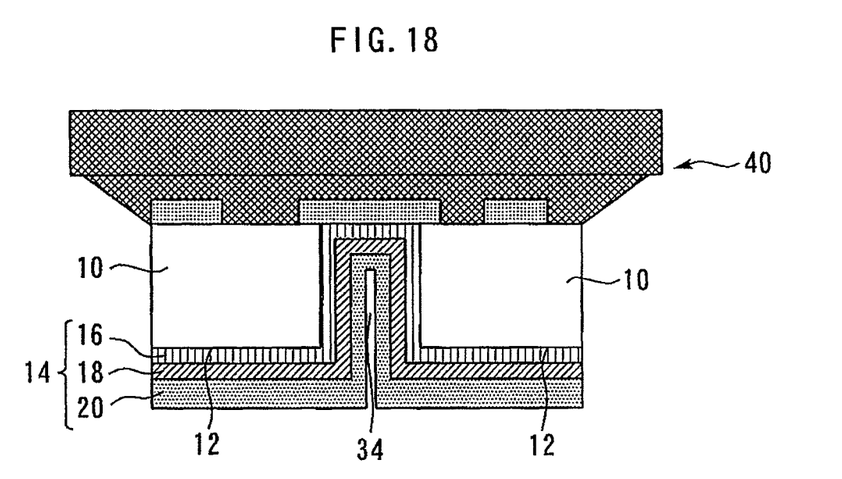

Next, as shown in FIG. 18, an Ni-alloy layer (second metal layer) 18 is formed on the diffusion barrier layer 16 using electroless plating. Here, the Ni-alloy layer 18 is formed on the diffusion barrier layer 16 in the through-hole 34. The Ni-alloy layer 18 is composed of Ni—P, and the thickness thereof is 0.3 μm.

Similarly, as shown in FIG. 18, a high-conductivity layer 20 is formed on the Ni-alloy layer 18 using electrolytic plating. Here, the high-conductivity layer 20 is formed on the Ni-alloy layer 18 in the through-hole 34. The high-conductivity layer 20 is composed of Au, and the thickness thereof is 4 μm.

Figure 19:
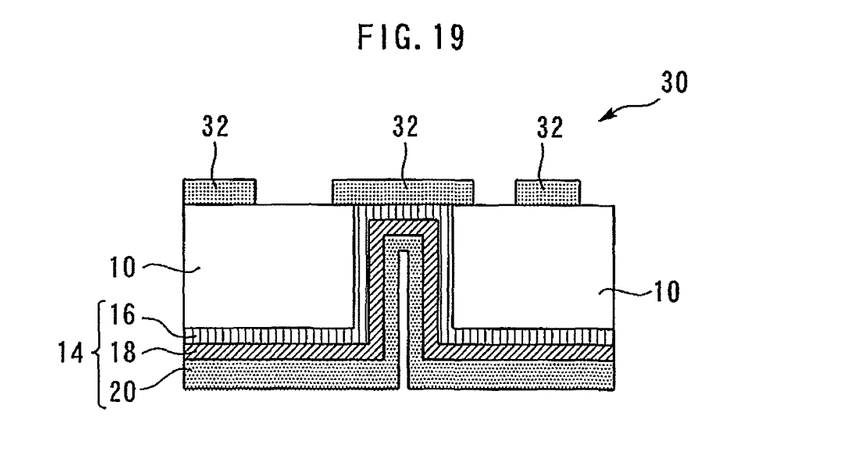

Next, as shown in FIG. 19, the glass substrate 40 is stripped off the GaAs substrate 10, and the wax is removed from the GaAs substrate 10 by cleaning with an organic material. Next, the entire semiconductor device including the integrated circuit 30, the GaAs substrate 10, the diffusion barrier layer 16, Ni-alloy layer 18, and the high-conductivity layer 20, is annealed at 250° C.

Figure 20:
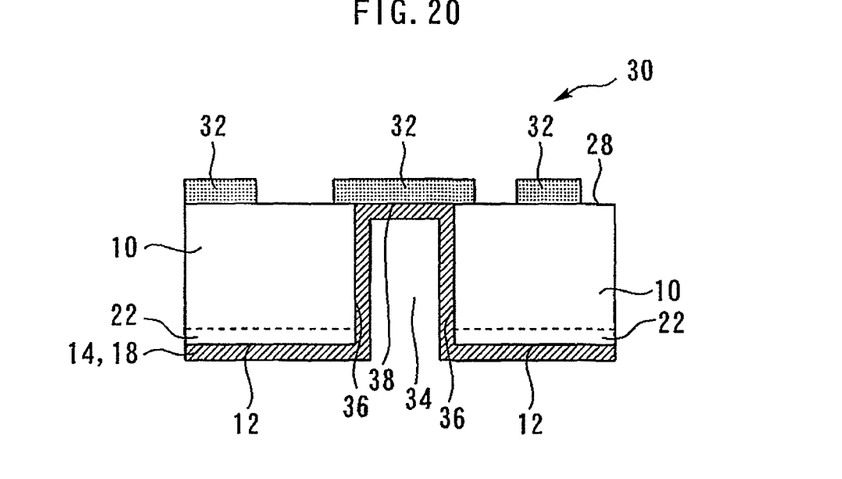
FIG. 20 is a sectional view showing a semiconductor device according to the second comparative example.

FIG. 20 is a sectional view showing a semiconductor device according to the second comparative example. The effect of the second embodiment will be described referring to FIG. 20.

In the semiconductor device according to the second comparative example, an integrated circuit 30 is formed on the second major surface 28 of the GaAs substrate 10. A through-hole 34 is formed in the GaAs substrate 10. An Ni-alloy layer 18 is formed as the electrode layer 14 on the first major surface 12 of the GaAs substrate 10 and in the through-hole 34. However, the diffusion barrier layer 16 is not provided between the GaAs substrate 10 and the Ni-alloy layer 18. Furthermore, the high-conductivity layer 20 is not provided on the Ni-alloy layer 18.

Consequently, as described in the description of the problems, when the entire semiconductor device including the GaAs substrate 10 and the Ni-alloy layer 18 is annealed at 250° C., Ni is diffused from the Ni-alloy layer 18 into the GaAs substrate 10. Thereby, the Ni—GaAs diffused layer 22 is formed, and the GaAs substrate 10 or the Ni—GaAs diffused layer 22 is subjected to stress. Therefore, a problem of warpage of the wafer including the GaAs substrate 10 and the Ni-alloy layer 18 is caused.

On the other hand, in the semiconductor device according to the second embodiment, the diffusion barrier layer 16 is formed between the GaAs substrate 10 and the Ni-alloy layer 18. The diffusion barrier layer 16 is composed of Pd, and the thickness thereof is 0.05 μm.

Consequently, diffusion of Ni from the Ni-alloy layer 18 into the GaAs substrate 10 can be prevented. Thereby, as in the first embodiment, crystallization of Ni-alloy in the Ni-alloy layer 18 can be suppressed. Formation of the Ni—GaAs diffused layer 22 on the GaAs substrate 10 is also suppressed. As a result, the GaAs substrate 10 or the Ni—GaAs diffused layer 22 is not subjected to stress. Therefore, warpage of wafer can be prevented.

In addition, the high-conductivity layer 20 is formed on the Ni-alloy layer 18. Therefore, as in the first embodiment, conductivity of the electrode layer 14 can be improved. Particularly, since the high-conductivity layer 20 is formed on the Ni-alloy layer 18 in the through-hole 34, the conductivity between the electrode layer 14 and the grounding electrode 32 can be improved.

Furthermore, unlike the first embodiment, the diffusion barrier layer 16 is also formed on the sides 36 of the through-hole, and the exposed surface 38 in the through-hole of the grounding electrode. Therefore, in comparison with the first embodiment, stripping of the electrode layer 14 including the diffusion barrier layer 16 from the GaAs substrate 10 can be effectively prevented.

Figure 21:
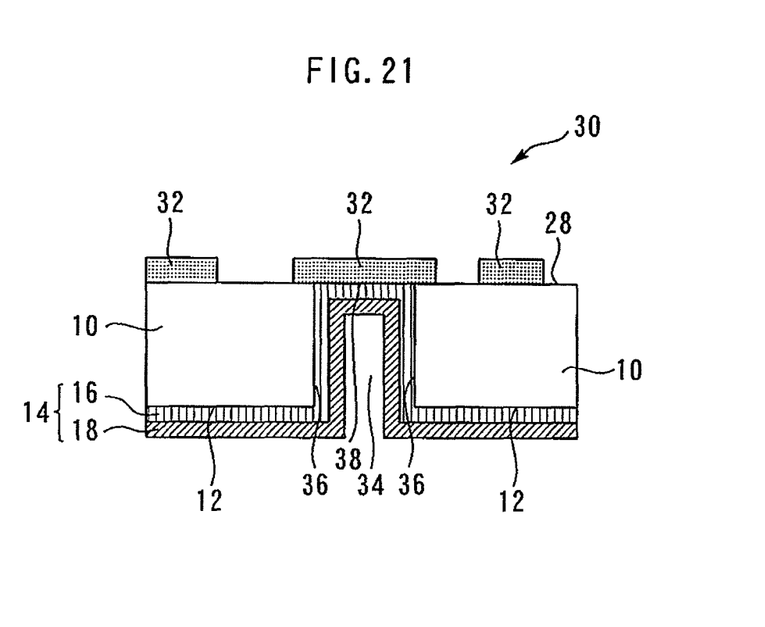
FIG. 21 is a longitudinal section view showing a semiconductor device according to the variation of the second embodiment.

A variation of the second embodiment will be described below. FIG. 21 is a longitudinal section view showing a semiconductor device according to the variation of the second embodiment. In the variation, the high-conductivity layer 20 is not provided on the Ni-alloy layer 18. In the method for manufacturing a semiconductor device according to the variation, after the Ni-alloy layer 18 is formed, the high-conductivity layer 20 is not formed on the Ni-alloy layer 18. Consequently, in comparison with the second embodiment, the structure of the semiconductor device and the manufacturing method thereof can be simplified. As in the second embodiment, warpage of wafer can be prevented.

In the method for manufacturing the semiconductor device according to the second embodiment, the glass substrate 40 can be applied to the GaAs substrate 10 using a double-sided adhesive tape in place of wax.

The through-hole 34 can be formed by not only dry etching but also wet etching.

Third Embodiment

Figure 22:
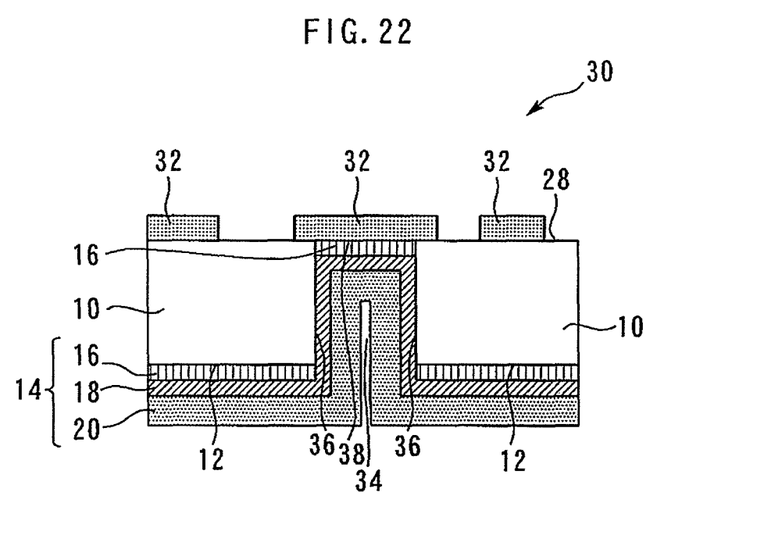
FIG. 22 is a sectional view showing a semiconductor device according to the third embodiment.

A semiconductor device according to the third embodiment will be described focusing the aspects different from the second embodiment. FIG. 22 is a sectional view showing a semiconductor device according to the third embodiment.

In the through-hole 34, the diffusion barrier layer (first metal layer) 16 is not formed on the sides 36 of the through-hole 34, but is formed only on the exposed surface 38 of a grounding electrode 32 in the through-hole 34. The Ni-alloy layer (second metal layer) 18 is formed on the sides 36 of the through-hole 34, and the diffusion barrier layer 16 in the through-hole 34.

Figure 23:
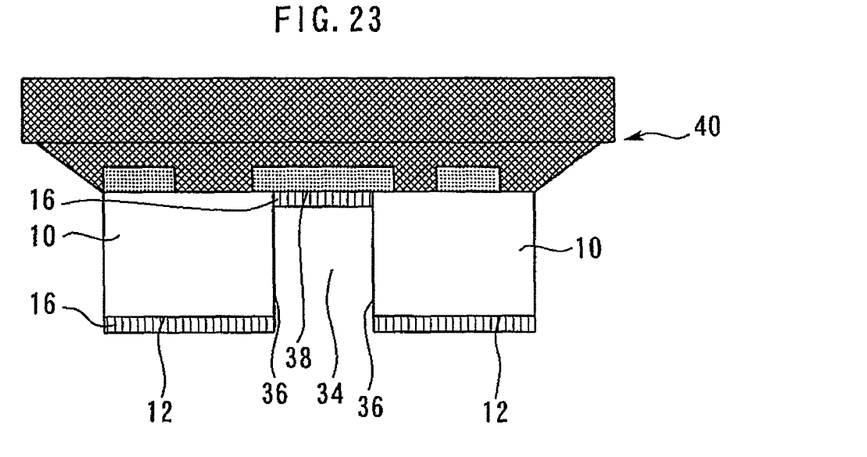
FIGS. 23 to 25 are views for explaining a method of manufacturing a semiconductor device according to the third embodiment of the present invention.
Figure 24:
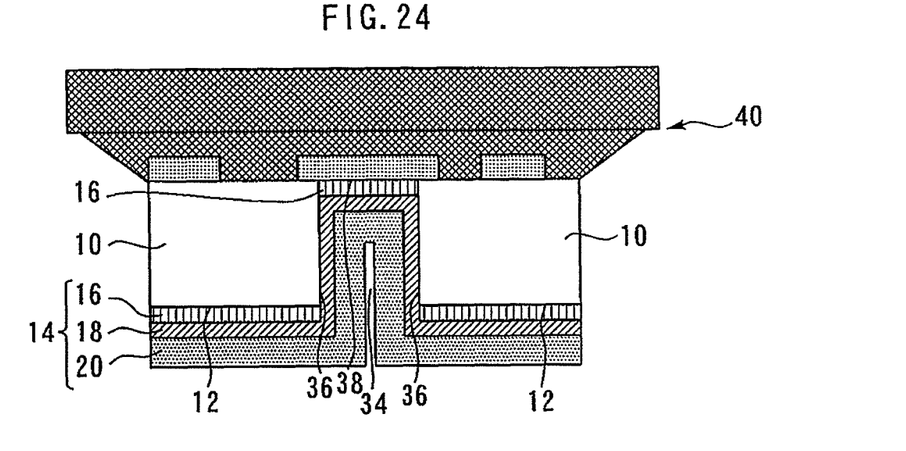
Figure 25:
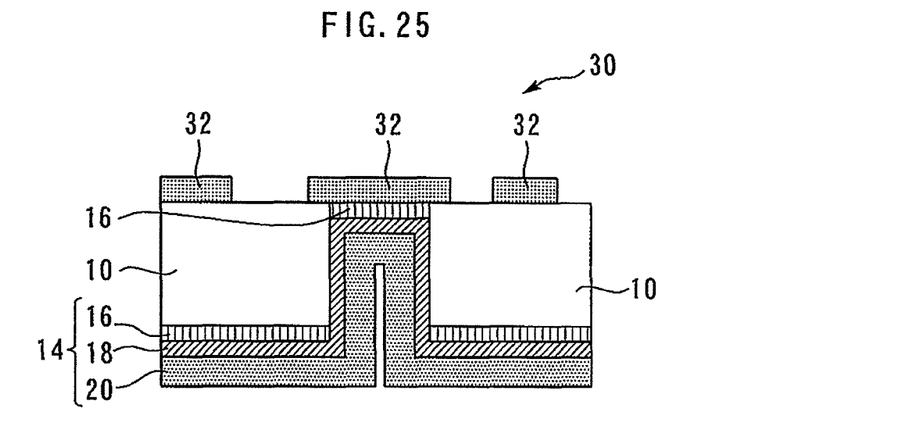

A method for manufacturing a semiconductor device according to the third embodiment will be described focusing the aspects different from the second embodiment. FIGS. 23 to 25 are process diagrams showing the essential parts of the method for manufacturing a semiconductor device according to the third embodiment.

As shown in FIG. 23, a diffusion barrier layer (first metal layer) 16 is formed by sputtering on the first major surface 12 of the GaAs substrate 10 and in the through-hole 34. Thereby, in the through-hole 34, the diffusion barrier layer 16 is formed only on the exposed surface 38 of a grounding electrode 32 in the through-hole 34.

Next, as shown in FIG. 24, after performing Pd activation as a pretreatment, an Ni-alloy layer (second metal layer) 18 is formed using electroless plating on the diffusion barrier layer 16. In the through-hole 34 the Ni-alloy layer 18 is formed on the sides 36 of the through-hole 34, and on the diffusion barrier layer 16 in the through-hole 34. Next, a high-conductivity layer 20 is formed.

Next, as shown in FIG. 25, the glass substrate 40 is stripped off the GaAs substrate 10, and the wax is removed. Then, the entire semiconductor device is annealed at 250° C.

The effect of the third embodiment will be described below. Unlike the second comparative example, in the semiconductor device according to the third embodiment, the diffusion barrier layer 16 is formed on the first major surface 12 of the GaAs substrate 10 between the GaAs substrate 10 and the Ni-alloy layer 18. Consequently, in the vicinity of the first major surface 12 of the GaAs substrate 10, the diffusion of Ni from the Ni-alloy layer 18 into the GaAs substrate 10 can be prevented. Therefore, crystallization of Ni alloy in the Ni-alloy layer 18 formed on the first major surface 12 of the GaAs substrate 10 can be suppressed. In addition, formation of the Ni—GaAs diffused layer 22 in the vicinity of the first major surface 12 of the GaAs substrate 10 can be suppressed.

Also unlike the second embodiment, the diffusion barrier layer 16 is not formed between the GaAs substrate 10 and the Ni-alloy layer 18 on the sides 36 of the through-hole 34. Consequently, Ni may be diffused from the Ni-alloy layer 18 to the vicinity of the sides 36 of the through-hole 34 in the GaAs substrate 10. However, even if Ni is diffused to the vicinity of the through-hole 34 in the GaAs substrate 10, no problem of warpage of wafer is caused. Therefore, in the third embodiment, even if the diffusion barrier layer 16 is not formed on the sides 36 of the through-hole 34, the warpage of the wafer can be prevented. A high-conductivity layer 20 is also formed on the Ni-alloy layer 18. Consequently, the conductivity of the electrode layer 14 can be improved.

Furthermore, unlike the second embodiment, an Ni-alloy layer 18 is formed on the sides 36 of the through-hole in place of the diffusion barrier layer 16. The Ni-alloy layer 18 has a higher adhesiveness to the GaAs substrate 10 than the diffusion barrier layer 16. Consequently, in comparison with the second embodiment, stripping of the electrode layer 14 from the GaAs substrate 10 can be more effectively prevented.

Figure 26:
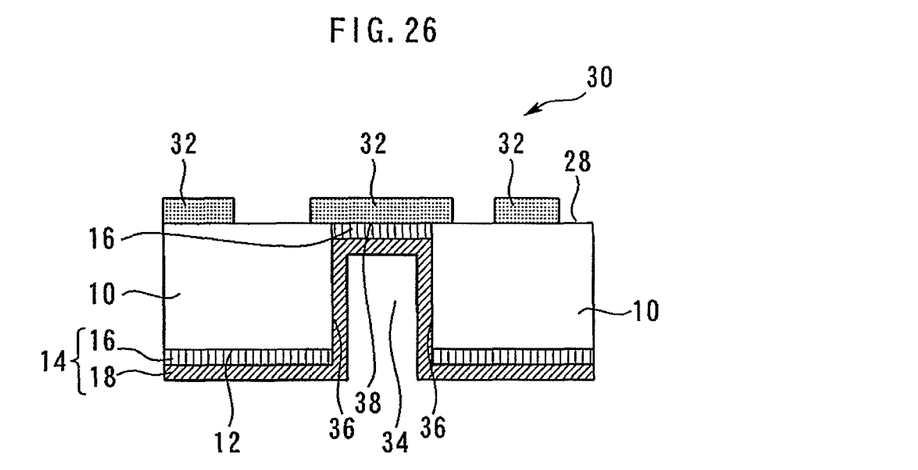
FIG. 26 is a longitudinal section view of a semiconductor device according to the variation of the third embodiment.

The variation of the third embodiment will be described below. FIG. 26 is a longitudinal section view of a semiconductor device according to the variation of the third embodiment. In this variation, the high-conductivity layer 20 is not provided on the Ni-alloy layer 18. In the method for manufacturing the semiconductor device according to this variation, after the Ni-alloy layer 18 is formed, the high-conductivity layer 20 is not formed on the Ni-alloy layer 18. Consequently, in comparison with the third embodiment, the structure of the semiconductor device and the manufacturing method thereof can be simplified; and in the same manner as in the third embodiment, warpage of the wafer can be prevented.

In the third embodiment, the diffusion barrier layer 16 can be formed by vapor deposition in place of sputtering. In this case, the diffusion barrier layer 16 is also formed in the through-hole 34 only on the exposed surface 38 of a grounding electrode 32 in the through-hole 34. Therefore, the same effect can be obtained.

When the diffusion barrier layer 16 is formed by sputtering or vapor deposition, the diffusion barrier layer 16 may be formed on the sides 36 of the through-hole 34. In this case, the thickness of the diffusion barrier layer 16 on the sides 36 of the through-hole 34 becomes 1/10 or less of the thickness of the diffusion barrier layer 16 on the first major surface 12. In this case also, warpage of the wafer including the GaAs substrate 10 and the electrode layer 14 can be prevented.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-191093, filed on Aug. 20, 2009 including specification, claims, drawings and summary, on which the Convention priority of the present application is based, are incorporated herein by reference in its entirety.

What is claimed is:

1. A semiconductor device comprising:
   a GaAs substrate having a first major surface and a second major surface opposite to each other;
   a nickel diffusion barrier disposed on the first major surface of the GaAs substrate, wherein
   the nickel diffusion barrier comprises a layer of Ta and a layer of Mo; and
   a nickel-containing layer disposed on the nickel diffusion barrier, wherein
   the nickel diffusion barrier is interposed between the first major surface of the GaAs substrate and the nickel-containing layer,
   the layer of Mo is located between the layer of Ta and the nickel-containing layer and the nickel diffusion barrier prevents nickel from diffusing from the nickel-containing layer into the GaAs substrate.

2. The semiconductor device according to claim 1, further comprising a circuit, including a grounding electrode, on the second major surface of the GaAs substrate, wherein
the GaAs substrate includes a through-hole passing through the GaAs substrate from the first major surface to a location of the grounding electrode on the second major surface,
the nickel diffusion barrier is disposed on side surfaces of the through-hole and on an exposed surface of the grounding electrode in the through-hole, and
the nickel-containing layer is disposed on the nickel diffusion barrier in the through-hole.

3. The semiconductor device according to claim 2, wherein the nickel diffusion barrier on the side surfaces of the through-hole has a thickness that is 1/10 or less of thickness of the nickel diffusion barrier on the first major surface.

4. The semiconductor device according to claim 1, further comprising a circuit, including a grounding electrode, on the second major surface of the GaAs substrate, wherein
the GaAs substrate includes a through-hole passing through the GaAs substrate from the first major surface to a location of the grounding electrode on the second major surface,
the nickel diffusion barrier is disposed on an exposed surface of the grounding electrode in the through-hole, and
the nickel-containing layer is disposed on side surfaces of the through-hole and on the nickel diffusion barrier in the through-hole.

5. The semiconductor device according to claim 1, further comprising a high electrical conductivity metal layer, including a metal selected from the group consisting of Au, Ag, and Cu, disposed on the nickel-containing layer.

6. The semiconductor device according to claim 1, wherein the nickel diffusion barrier is at least 0.05 μm thick.

7. A semiconductor device comprising:
a GaAs substrate having a first major surface and a second major surface opposite to each other;
a nickel diffusion barrier disposed on the first major surface of the GaAs substrate, wherein
the nickel diffusion barrier consists of a layer of Ta and a layer of Mo; and
a nickel-containing layer disposed on the nickel diffusion barrier, wherein
the nickel diffusion barrier is interposed between the first major surface of the GaAs substrate and the nickel-containing layer,
the layer of Mo is located between the layer of Ta and the nickel-containing layer and
the nickel diffusion barrier prevents nickel from diffusing from the nickel-containing layer into the GaAs substrate.

8. The semiconductor device according to claim 7, further comprising a circuit, including a grounding electrode, on the second major surface of the GaAs substrate, wherein
the GaAs substrate includes a through-hole passing through the GaAs substrate from the first major surface to a location of the grounding electrode on the second major surface,
the nickel diffusion barrier is disposed on side surfaces of the through-hole and on an exposed surface of the grounding electrode in the through-hole, and
the nickel-containing layer is disposed on the nickel diffusion barrier in the through-hole.

9. The semiconductor device according to claim 8, wherein the nickel diffusion barrier on the side surfaces of the through-hole has a thickness that is 1/10 or less of thickness of the nickel diffusion barrier on the first major surface.

10. The semiconductor device according to claim 7, further comprising a circuit, including a grounding electrode, on the second major surface of the GaAs substrate, wherein
the GaAs substrate includes a through-hole passing through the GaAs substrate from the first major surface to a location of the grounding electrode on the second major surface,
the nickel diffusion barrier is disposed on an exposed surface of the grounding electrode in the through-hole, and
the nickel-containing layer is disposed on side surfaces of the through-hole and on the nickel diffusion barrier in the through-hole.

11. The semiconductor device according to claim 7, further comprising a high electrical conductivity metal layer, including a metal selected from the group consisting of Au, Ag, and Cu, disposed on the nickel-containing layer.

12. The semiconductor device according to claim 7, wherein the nickel diffusion barrier is at least 0.05 μM thick.

* * * * *